US012573446B2

(12) United States Patent　　　　　(10) Patent No.:　US 12,573,446 B2
Platt et al.　　　　　　　　　　　　　(45) Date of Patent:　Mar. 10, 2026

(54) MAIN WORDLINE DECODING CIRCUITRY

(71) Applicant: Micron Technology, Inc., Boise, ID (US)

(72) Inventors: Kevin John Platt, McKinney, TX (US); Mark W. Keefer, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 231 days.

(21) Appl. No.: 18/493,692

(22) Filed: Oct. 24, 2023

(65) Prior Publication Data

US 2024/0212741 A1　　Jun. 27, 2024

Related U.S. Application Data

(60) Provisional application No. 63/476,836, filed on Dec. 22, 2022.

(51) Int. Cl.
　　*G11C 7/02*　　　(2006.01)
　　*G11C 11/408*　　(2006.01)
　　*G11C 11/4091*　 (2006.01)
(52) U.S. Cl.
　　CPC ...... *G11C 11/4087* (2013.01); *G11C 11/4082* (2013.01); *G11C 11/4085* (2013.01); *G11C 11/4091* (2013.01)
(58) Field of Classification Search
　　CPC ............ G11C 11/4087; G11C 11/4082; G11C 11/4085; G11C 11/4091

USPC .......................................................... 365/207
See application file for complete search history.

(56) References Cited

U.S. PATENT DOCUMENTS

| | | | | |
|---|---|---|---|---|
| 6,079,037 | A | * | 6/2000 | Beffa ...................... G11C 29/10 |
| | | | | 714/720 |
| 6,556,503 | B2 | * | 4/2003 | Schreck ................... G11C 8/10 |
| | | | | 365/230.06 |
| 6,646,949 | B1 | * | 11/2003 | Ellis ......................... G11C 8/08 |
| | | | | 365/189.11 |
| 10,037,790 | B2 | * | 7/2018 | Andre ................. G11C 11/1693 |
| 10,521,287 | B2 | * | 12/2019 | Khoueir ................ G11C 16/26 |
| 11,417,382 | B2 | * | 8/2022 | Arai ..................... G11C 29/783 |

* cited by examiner

*Primary Examiner* — Viet Q Nguyen
(74) *Attorney, Agent, or Firm* — Fletcher Yoder, P.C.

(57)　　　　　　ABSTRACT

A memory device includes multiple decoding unit circuitries configured to decode a first set of addressing bits to multiple wordline arming bits each configured to arm a corresponding wordline. Each decoding unit circuitry includes multiple sub-units each configured to decode a second set of addressing bits to a respective subset of the multiple wordline arming bits. The multiple sub-units each include an inverter configured to invert the second set of addressing bits and to output a wordline arming signal. The inverter is coupled between a supply voltage and a common node that is configured to be coupled to and decoupled from a common return by one or more transistors of the wordline decoding circuitry. The multiple-sub-units and each include a bleed transistor that is configured to bleed charge onto the wordline arming signal to mitigate for a potential floating condition of the common node.

20 Claims, 10 Drawing Sheets

250

256   258   260   262   264   266        224        268
270                                              204   186

| MP2 | MP4 | MP1 | MP1 |   | MN5 | MN1 |
| MP2 | MP4 | MP1 |      |   | MN5 | MN1 |
| MP2 | MP4 | MP1 | MP0 |   | MN5 | MN1 |
| MP2 | MP4 | MP1 |      |   | MN5 | MN1 |
| MP2 | MP4 | MP1 |      |   | MN5 | MN1 |
| MP2 | MP4 | MP1 |      |   | MN5 | MN1 |
| MP2 | MP4 | MP1 | MP0 |   | MN5 | MN1 |
| MP2 | MP4 | MP1 |      |   | MN5 | MN1 |
| MP2 | MP4 | MP1 |      |   | MN5 | MN1 |
| MP2 | MP4 | MP1 | MP0 |   | MN5 | MN1 |
| MP2 | MP4 | MP1 |      |   | MN5 | MN1 |
| MP2 | MP4 | MP1 |      |   | MN5 | MN1 |
| MP2 | MP4 | MP1 | MP0 |   | MN5 | MN1 |
| MP2 | MP4 | MP1 |      |   | MN5 | MN1 |
| MP2 | MP4 | MP1 |      |   | MN5 | MN1 |
| MP2 | MP4 | MP1 | MP0 |   | MN5 | MN1 |
| MP2 | MP4 | MP1 |      |   | MN5 | MN1 |
| MP2 | MP4 | MP1 |      |   | MN5 | MN1 |
| MP2 | MP4 | MP1 | MP0 |   | MN5 | MN1 |
| MP2 | MP4 | MP1 |      |   | MN5 | MN1 |
| MP2 | MP4 | MP1 | MP0 |   | MN5 | MN1 |
| MP2 | MP4 | MP1 |      |   | MN5 | MN1 |
| MP2 | MP4 | MP1 |      |   | MN5 | MN1 |

252        254

MAIN WORDLINE DECODING CIRCUITRY

CROSS-REFERENCE TO RELATED APPLICATIONS

This application claims priority to U.S. Application No. 63/476,836, filed Dec. 22, 2022, entitled "Main Wordline Decoding Circuity," the disclosure of which is incorporated by reference herein in its entirety for all purposes.

BACKGROUND

Field of the Present Disclosure

Embodiments of the present disclosure relate generally to memory devices. More specifically, embodiments of the present disclosure relate to main wordline decoders used to activate and use sense amplifiers of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device. In this manner, the processor may communicate with the memory device, for example, to retrieve executable instructions, retrieve data to be processed, by the processor, and/or store data output from the processor. The retrieval and storage of data in the memory device may use wordlines. Since there are numerous wordlines that may be used, addressing of target locations may be decoded from addressing bits. However, the size consumed by decoding circuitry may consume layout space in the memory device that may make such space unavailable for other usage and/or may increase the overall size of the memory device.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, the read circuitry of the memory device utilizes the sense amplifiers to receive low voltage (e.g., low differential) signals and amplify the small voltage differences to enable the memory device to interpret the data properly. The usage of the sense amplifiers and/or other read/write operations may utilize wordlines to perform read and/or write operations. Since there are numerous wordlines in a memory device that may be separately addressed, the memory device may include decoding circuitry to arm the correct wordlines for the specific target endpoints of the read and/or write operations. Furthermore, the decoding circuitry may be used to level shift low level voltage signals (e.g., 1 V) to appropriate levels (e.g., 3V) for usage. By using the lower level for transmission/routing before usage, power consumption may be reduced in the memory device. Furthermore, the decoding circuitry may include bleed circuitry to mitigate potential firing issues in the memory device caused due to wordline floating. Additionally, some embodiments, may include a deactivation circuitry to shut down the wordline activation before a control signal may propagate by using a signal that is used to generate an activation signal rather than the propagated activation signal. Furthermore, in some embodiments, the decoding circuitry may use pre-charge circuitry to charge a common node to a specific voltage (e.g., 3V) when a section of decoding circuitry (and related wordlines) are deactivated to ameliorate any potential degradation of a transistor coupled to the common node.

Figure 1:
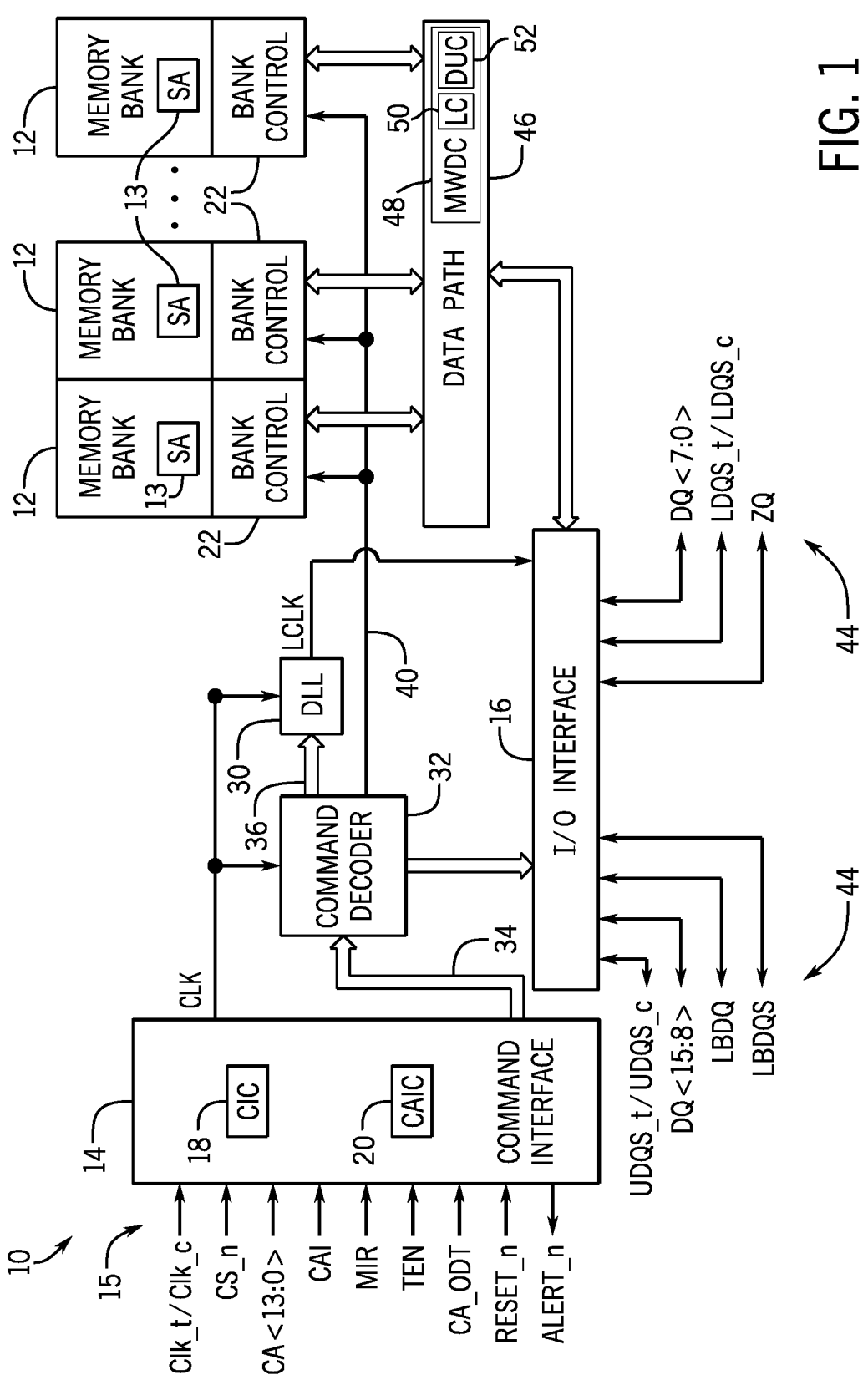
FIG. 1 is a simplified block diagram illustrating certain features of a memory device having bank control that includes decoding circuitry having level shifting circuitry and decoding unit circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 22 include sense amplifiers 13. As previously noted, sense amplifiers 13 are used by the memory device 10 during read operations. Specifically, read circuitry of the memory device 10 utilizes the sense amplifiers 13 to receive low voltage (e.g., low differential) signals from the memory cells of the memory banks 12 and amplifies the small voltage differences to enable the memory device 10 to interpret the data properly.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar/complementary clock signal Clk_c. The positive clock edge for DDR refers to the point where the rising true clock signal Clk_t crosses the falling complementary clock signal Clk_c, while the negative clock edge indicates the transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the complementary clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/ address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device 10 as being a DDR5 device, the memory device 10 may be any suitable device (e.g., a low-power double data rate (LPDDR) device, a double data rate type 4 DRAM (DDR4) device, a ferroelectric RAM device, or a combination of different types of memory devices).

As may be appreciated, the sense amplifiers 13 (and corresponding circuitry) may be disabled when unused. Furthermore, as there are numerous sense amplifiers 13 with respective wordlines, the activation and usage of these wordlines may be controlled using main wordline decoder circuitry (MWDC) 48. The wordlines are used to toggle an access transistor for memory cells. The corresponding memory cell dumps charge on a local digit line when the wordline access transistor is turned on. The sense amplifiers 13 sense and amplify the digit line movement that is based on the respective wordlines.

Although the illustrated embodiment of the MWDC 48 is located in the data path 46, the memory device 10 may include the MWDC 48 in any other location, such as in the bank control 22, the memory bank 12 (e.g., at or near the sense amplifiers 13), and/or any other suitable location. As discussed below, the voltage of some addressing bits into the MWDC 48 may be lower than an outgoing voltage used to arm a respective wordline using the MWDC 48. Accordingly, the MWDC 48 may include level-shifting circuitry (LC) 50 to shift voltage levels. The MWDC 48 may also include decoding unit circuitry (DUC) 52 that is used to decode multiple addressing bits into wordline arming bits. Some of the addressing bits may have been shifted from a first voltage domain (e.g., VPERI at 1V) to a second voltage domain (e.g., VCCP at 3V) while some addressing bits remain in the first voltage domain.

Figure 2:
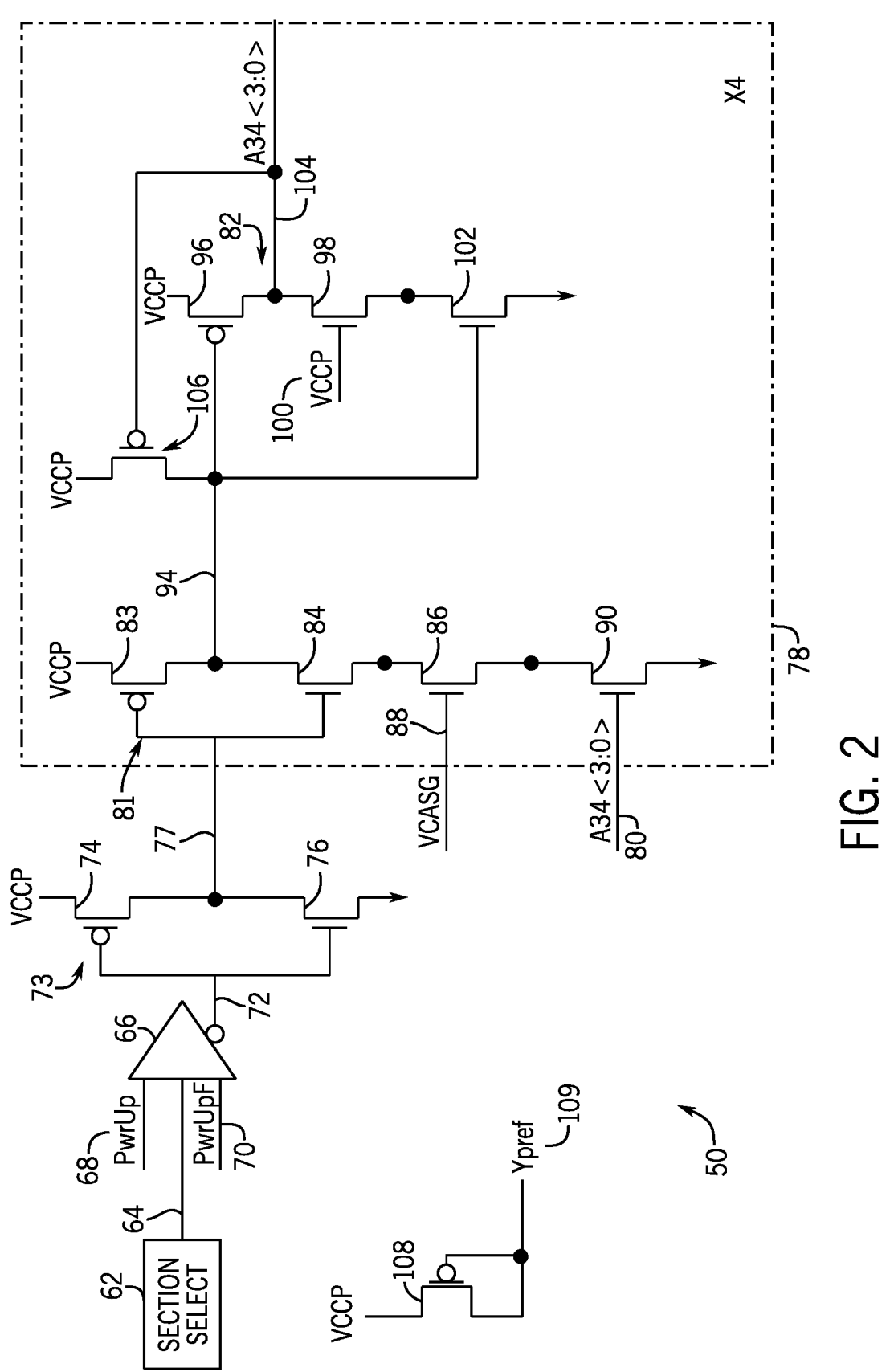
FIG. 2 is a circuit diagram of the level shifting circuitry of FIG. 1 with first and second level shifters, according to an embodiment of the present disclosure.

FIG. 2 is a circuit diagram of an embodiment of the LC 50 of FIG. 1. The LC 50 receives a section select signal known as an RMSXDP_LV signal 64 from section select logic 62 implemented in hardware, software, or a combination thereof. The section select signal 64 may be in the first voltage domain. To boost the voltage level from the first voltage domain to the second voltage domain, the LC 50 uses a level shifter 66. The level shifter 66 may utilize a PwrUp signal 68 to control whether the level shifting is to occur in the level shifter 66 where the PwrUp signal 68 indicates whether the memory device 10 has been powered on. Additionally or alternatively, in some embodiment, the LC 50 may utilize a PwrUpF signal 70 that is complementary to the PwrUp signal 68. As discussed, below, the level shifter 66 outputs an RMSXDPN signal 72 that is a level-shifted and inverted version of the RMSXDP_LV signal 64. The RMSXDPN signal 72 is then passed to an inverter 73. The inverter 73 includes a PMOS transistor 74 that receives the RMSXDPN signal 72 at its gate terminal. Another terminal of the PMOS transistor 74 is coupled to VCCP. VCCP may be at or near the second voltage level (e.g., 3V) to which the RMSXDPN signal 72 has been pulled by the level shifter 66. The inverter 73 also includes an NMOS transistor 76 that has its gate terminal coupled to the RMSXDPN signal 72. Another terminal of the NMOS transistor 76 is coupled to a common return (e.g., VSS). The third terminal of the NMOS transistor 76 is coupled to a third terminal of the PMOS transistor 74. The inverter 73 uses the NMOS transistor 76 and the PMOS transistor 74 to invert the RMSXDPN signal 72 to produce an RMSXDP signal 77 between the PMOS transistor 74 and the NMOS transistor 76. The RMSXDP signal 77 is a section enable signal that is a level-shifted version of the RMSXDP_LV signal 64.

The RMSXDP signal 77 is transmitted to one or more addressing bit level shifters 78. The one or more addressing bit level shifters 78 receive respective addressing bits A34<3:0> 80. As previously noted, these addressing bits to be level shifted may be only a portion of addressing bits for addressing respective wordlines. For instance, in the illustrated embodiment, four addressing bits are used and four addressing bit level shifters 78 may be used. However, in some embodiments, other numbers of addressing bits may be level shifted.

Each of the addressing bit level shifters 78 includes inverters 81 and 82. The inverter 81 includes a PMOS transistor 83 that receives the RMSXDP signal 77 at its gate terminal. Another terminal of the PMOS transistor 83 is coupled to VCCP. VCCP may be at or near the second voltage level (e.g., 3V) to which the addressing bits are to be pulled by the addressing bit level shifters 78. The inverter 81 also includes an NMOS transistor 84 that has its gate terminal coupled to the RMSXDP signal 77. A terminal of the NMOS transistor 84 is coupled to a third terminal of the PMOS transistor 83. A drain of the inverter 81 is controlled by a connection through transistors 86 and 90 to the common return (e.g., VSS). This connection is controlled by a respective addressing bit of A34<3:0> 80 that is connected to a gate terminal of the transistor 90 to act as the negative supply for the inverter 81. The transistor 86 has its gate terminal coupled to a cask node voltage (VCASG) 88 that is used to mitigate degradation of the transistor 90.

The inverter 82 buffers an output 94 of the inverter 81. The output 94 of the inverter 81 is a level-shifted and inverted respective address bit A34<3:0> 80. The inverter 82 includes a PMOS transistor 96 that receives the output 94 of the inverter 81 at its gate terminal. Another terminal of the PMOS transistor 96 is coupled to VCCP. The inverter 82 also includes an NMOS transistor 98 that has its gate terminal coupled to the output 94 of the inverter 81. A terminal of the NMOS transistor 98 is coupled to a third terminal of the PMOS transistor 96. A drain of the inverter 82 is controlled by a connection through transistor 102 to the common return (e.g., VSS). This connection is controlled by the output 94 of the inverter 81 that is coupled to the gate of the transistor 102. An output of the inverter 82 is a respective address bit of A34<3:0> 104 that is a level-shifted version of the corresponding address bit of A34<3:0> 80. The addressing bit level shifter 78 may also include a feedback loop with the respective bit of A34<3:0> 104 coupled to a gate of a PMOS transistor 106 that pulls the output 94 of the inverter 81 up toward VCCP when the respective bit of A34<3:0> 104 is low as the output 94 should be inverse of the respective bit of A34<3:0> 104. The PMOS transistor 106 may be relatively weak to prevent floating of the output 94. As previously noted, the different instances of the addressing bit level shifters 78 provide level shifting for the different bits of A34<3:0> 104.

Furthermore, as noted below, a bleeding voltage may be used to bleed charge onto a main wordline to mitigate misfires when main wordline decoding circuitry is not coupled to ground. The misfires are caused by floating of the main wordline that may cause coupling of the main wordline in a bank 12 of the memory device 10. To create this bleeding voltage, a PMOS transistor 108 may have its source terminal coupled to VCCP and its gate and drain terminals coupled together. The voltage on the gate and drain terminals, Vpref 109, is the bleeding voltage and is a threshold voltage (e.g., the threshold voltage of the PMOS transistor 108) lower than VCCP.

Figure 3:
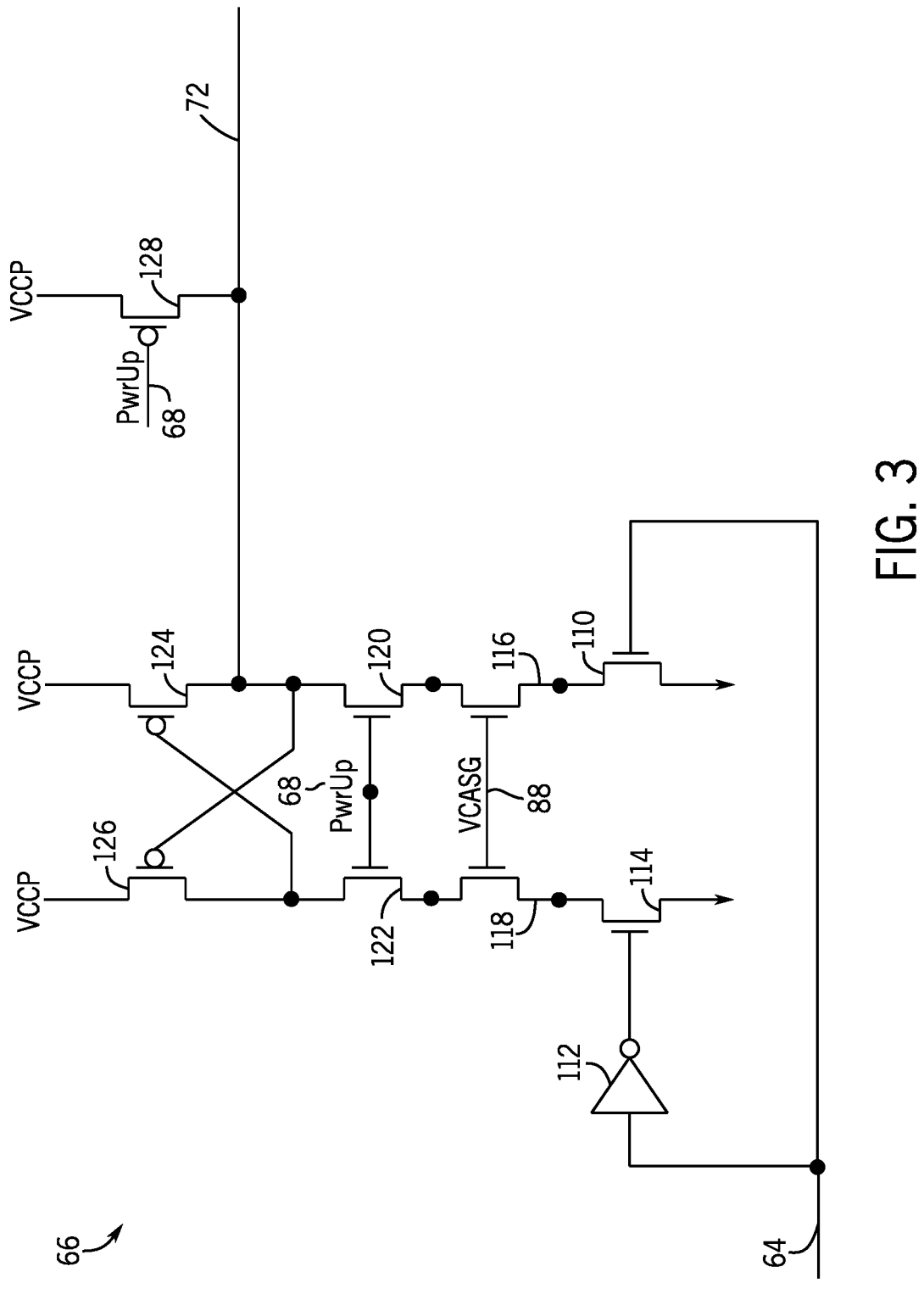
FIG. 3 is a circuit diagram of the first level shifter of FIG. 2, according to an embodiment of the present disclosure.

FIG. 3 is a circuit diagram of an embodiment of the level shifter 66 of FIG. 2. As previously noted, the level shifter 66 receives the RMSXDP_LV signal 64 that is a section select signal at the first level (e.g., 1V). The lower voltage levels may be routed at lower power levels to save power consumption. The RMSXDP_LV signal 64 is transmitted to a gate terminal of an NMOS transistor 110 and to an inverter 112 that inverts the RMSXDP_LV signal 64 and transmits the inverted version of RMSXDP_LV signal 64 to a gate terminal of an NMOS transistor 114. The source terminals of the NMOS transistors 110 and 114 are coupled to a common return (e.g., VSS or ground). The drain terminals of the NMOS transistors 110 and 114 are each coupled to source terminals of respective NMOS transistors 116 and 118. The gate terminals of the NMOS transistors 116 and 118 are coupled to the VCASG 88. The drain terminals of the NMOS transistors 116 and 118 are coupled to source terminals of respective NMOS transistors 120 and 122. The gate terminals of the NMOS transistors 120 and 122 are both coupled to the PwrUp signal 68. The drain terminal of the NMOS transistor 120 is coupled to the drain terminal of a PMOS transistor 124 and a gate terminal of a PMOS transistor 126. Similarly, the drain terminal of the NMOS transistor 122 is coupled to the drain terminal of the PMOS transistor 126 and a gate terminal of the PMOS transistor 124. Furthermore, the source terminals of the PMOS transistors 124 and 126 are both coupled to VCCP that is the level to which the RMSXDP_LV signal 64 is boosted before decoding addressing bits.

If the RMSXDP_LV signal 64 is high, the NMOS transistor 110 couples the source terminal of the NMOS transistor 116 to the common return. Furthermore, if the VCASG 88 and the PwrUp signal 68 are both asserted, the NMOS transistors 116 and 120 couple the drain of the PMOS transistor 124 and the gate of the PMOS transistor 126 to the common return. This connection causes the drain terminal of the PMOS transistor 126 (and the gate of the PMOS transistor 124) to transition to be pulled up toward VCCP. This pull-up ensures that the RMSXDPN signal 72 is separated from VCCP by the PMOS transistor 124 while pulled down via the NMOS transistors 110, 116, and 120. The opposite occurs when the RMSXDP_LV signal 64 is low. In other words, the RMSXDPN signal 72 is inverse to the RMSXDP_LV signal 64 but varies between the common return and VCCP. In some embodiments, the level shifter 66 may include a PMOS transistor 128 that causes the RMSXDPN signal 72 to be pulled up to VCCP when PwrUp signal 68 is deasserted (e.g., low).

Figure 4:
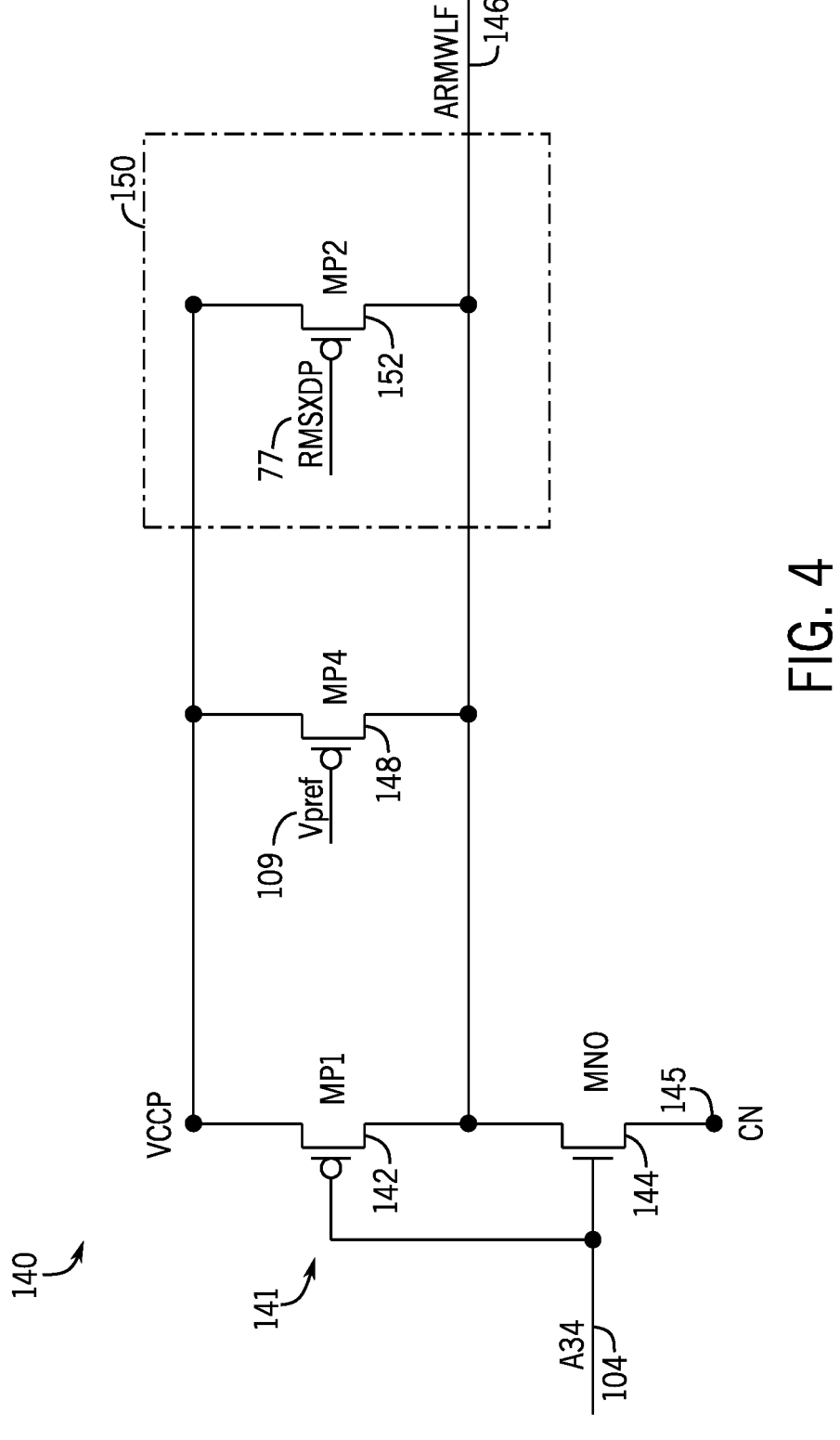
FIG. 4 is a circuit diagram of x1 decoding unit circuitry to decode a bit for wordline usage, according to an embodiment of the present disclosure.

As previously noted the decoding unit circuitry 52 may be made of decoding units that decode a certain number (e.g., 1). These decoding units may be grouped into groups of more bits (e.g., 4 bits). As discussed below, these groupings may be thought of as a tree where bits may be grouped for decoding until a whole section may be selected with a common signal, such as the RMSXDP signal 77. For instance, a section corresponding to 16 wordlines may be selected that consists of 4 sub-sections each corresponding to 4 wordlines, and each of the 4 sub-sections may consist of 4 sub-sub-sections each corresponding to a wordline. Using this configuration, to select a wordline, the section is selected along with a corresponding sub-section within the selected section and a corresponding sub-sub-section within the selected sub-section, where the FIG. 4 shows a x1 main wordline decoder circuitry 140 that may be a foundational block for other units. As illustrated, the x1 main wordline decoder circuitry 140 includes an inverter 141 that is controlled by a respective bit of the A34<3:0> 104. The inverter 141 includes a PMOS transistor 142 (MP1) and an NMOS transistor 144 (MN0). A gate terminal of the PMOS transistor 142 is coupled to the respective bit of the A34<3:0> 104. A source terminal of the PMOS transistor 142 is connected to VCCP. The drain terminal of the PMOS transistor 142 is coupled to the drain terminal of the NMOS transistor 144. Like, the PMOS transistor 142, the gate terminal of the NMOS transistor 144 is coupled to the respective bit of the A34<3:0> 104. The source terminal of the NMOS transistor 144 is coupled to a node CN 145. As noted below, the node CN 145 is used to couple the NMOS transistor 144 to a common return (e.g., ground or VSS). However, since this path proceeds through other circuitry (e.g., decoding transistors), the value at the node CN 145 may differ from the common return value. As previously noted, this floating of CN 145 may cause floating of a main wordline due to floating of an ARMWLF signal 146. Thus, the inverter 141 generating the ARMWLF signal 146 from the A34 104 alone may cause floating issues and/or misfires. To mitigate this issue, the x1 main wordline decoder circuitry 140 may include a PMOS transistor 148 (MP4) that is coupled between VCCP and the ARMWLF signal 146. Vpref 109 is coupled to the gate terminal of the PMOS transistor 148. Since Vpref 109 is a threshold level lower than VCCP, the PMOS transistor 148 causes a voltage to be bled onto the ARMWLF signal 146. Since the ARMWLF signal 146 is asserted low, the bled charge causes the ARMWLF signal 146 to weakly/slowly move high (e.g., deassertion) from a floating state to ameliorate the floating condition.

Furthermore, a value of the ARMWLF signal 146 is based on the corresponding addressing bit of the A34 104 and decoding of the main wordline is based on the RMSXDP signal 77 for a particular group/section that includes the x1 main wordline decoder circuitry 140. However, the change to the addressing bit of the A34 104 when the main wordline is decoded may be delayed by a propagation delay through the level-shifting circuitry 50 and/or the decoding unit circuitry 52. In some embodiments, this propagation delay may be avoided by including an optional deactivation circuit 150 that relies on the RMSXDP signal 77 directly rather than waiting on propagation to A34 104. As previously noted, the ARMWLF signal 146 is asserted low. Thus, when the RMSXDP signal 77 transitions low indicating section deactivation, the ARMWLF signal 146 is pulled to VCCP through a PMOS transistor 152 (MP2).

Figure 5:
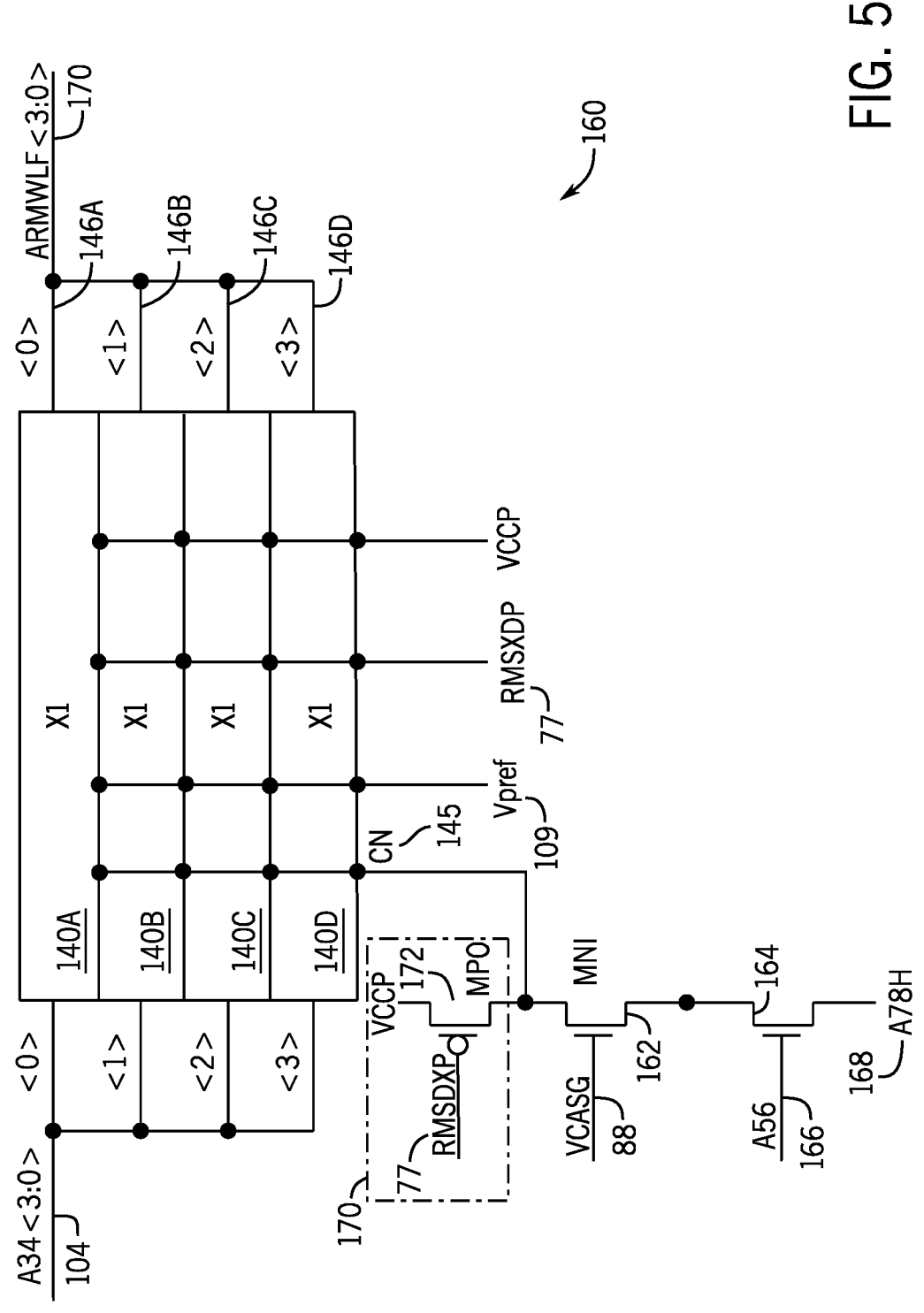
FIG. 5 is a circuit diagram of x4 decoding unit circuitry including four x1 decoding units of FIG. 4 to decode 4 bits for wordline usage, according to an embodiment of the present disclosure.

FIG. 5 is a diagram of an x4 main wordline decoder circuitry 160 that includes four x1 main wordline decoder circuitries 140 (individually referred to as 140A, 140B, 140C, and 140D). Each of the x1 main wordline decoder circuitries 140 receives its respective addressing bit of the address bits A34<3:0> 104 and outputs a respective bit <3:0> of the ARMWLF signal 146 (individually referred to as 146A, 146B, 146C, and 146D). As illustrated, each of the x1 main wordline decoder circuitries 140 is coupled to the CN node 145 and the Vpref 109. Each x1 main wordline decoder circuitry 140 may also be coupled to the RMSXDP signal 77 if the deactivation circuit 150 is used in the respective x1 main wordline decoder circuitries 140.

The x4 main wordline decoder circuitry 160 also includes NMOS transistors 162 and 164 that are used to at least partially control coupling the CN node 145 to the common return. The connection through the NMOS transistor 162 may be controlled using a corresponding address bit of A56 166 used to select a specific instance of the x4 main wordline decoder circuitry 160. The NMOS transistor 162 (MN1) may be relatively large compared to the NMOS transistor 164 and may use the VCASG 88 to protect the NMOS transistor 164. The NMOS transistor 164 is coupled to an A78H node 168 that, like the CN node 145, may be a connection for the x4 main wordline decoder circuitry 160 to the common return through additional decoding circuitry. In some embodiments, a single NMOS transistor (either the NMOS transistor 162 or 164) may be controlled by A56 166 with A56 being at VCASG level obviating the use of the other NMOS transistor 162 or 164.

In some embodiments, precharge circuitry 170 may be included in the x4 main wordline decoder circuitry 160 to precharge the CN node 145 when the x4 main wordline decoder circuitry 160 (and/or the entire section in which the x4 main wordline decoder circuitry 160 in included) is deactivated. This precharge may assist in mitigating degradation of the NMOS transistor 144 of the x1 main wordline decoder circuitries 140 of the x4 main wordline decoder circuitry 160. The precharge circuitry 170 includes a PMOS transistor 172 (MP0) that causes the CN nodes 145 to be charged to VCCP when the RMSXDP signal 77 is deactivated due to the group/section including the x4 main wordline decoder circuitry 160 being deactivated/unselected. The output of the x4 main wordline decoder circuitry 160 is ARMWLF<3:0> 170 that is a combination of the ARMWLF signals 146A, 146B, 146C, and 146D from the respective x1 main wordline decoder circuitries 140A, 140B, 140C, and 140D.

Figure 6:
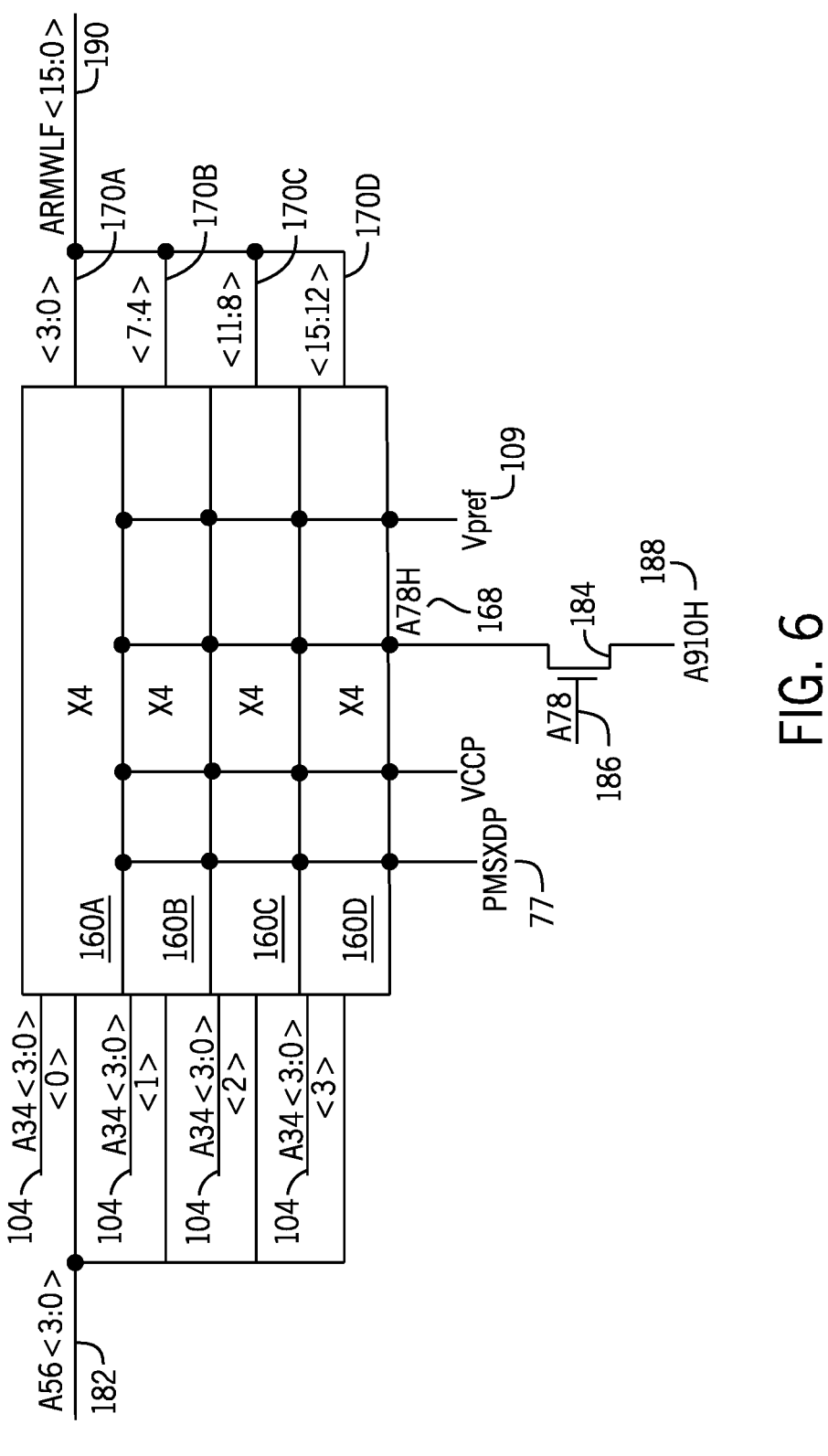
FIG. 6 is a circuit diagram of x16 decoding unit circuitry including four x4 decoding units of FIG. 5 to decode 16 bits for wordline usage, according to an embodiment of the present disclosure.

FIG. 6 is a diagram of an x16 main wordline decoder circuitry 180 that includes four x4 main wordline decoder circuitries 160 (individually referred to as 160A, 160B, 160C, and 160D). Each of the x4 main wordline decoder circuitries 160 receives its respective addressing bit of the address bits A56<3:0> 182. Each of the x1 main wordline decoder circuitries 140 of each of the x4 main wordline decoder circuitries 160 receives its respective addressing bit of the address bits A34<3:0> 104. Each of the x4 main wordline decoder circuitries outputs four respective bits of the ARMWLF<15:0> signal 190 that has 16 bits. The 4 respective bits may correspond to bits<3:0>, <7:4>, <11:8>, and <15:12> as ARMWLF signals 146 (individually referred to as 146A, 146B, 146C, and 146D). As illustrated, each of the x4 main wordline decoder circuitries 160 is coupled to the A78H node 168 and the Vpref 109. Each x4 main wordline decoder circuitry 140 may also be coupled to the RMSXDP signal 77 if the deactivation circuit 150 is used in the respective x1 main wordline decoder circuitries 140 and/or the precharge circuitry 170 is used in the respective x4 main wordline decoder circuitries 160.

The x16 main wordline decoder circuitry 180 also includes an NMOS transistor 184 that is used to at least partially control coupling the A78H node 168 to the common return. The connection through the NMOS transistor 184 may be controlled using a corresponding address bit of A78 186 used to select a specific instance of the x16 main wordline decoder circuitry 180. The NMOS transistor 184 is coupled to an A910H node 188 that, like the CN node 145 and the A78H node 168, may be a connection for the x16 main wordline decoder circuitry 180 to the common return through additional decoding circuitry.

Figure 7:
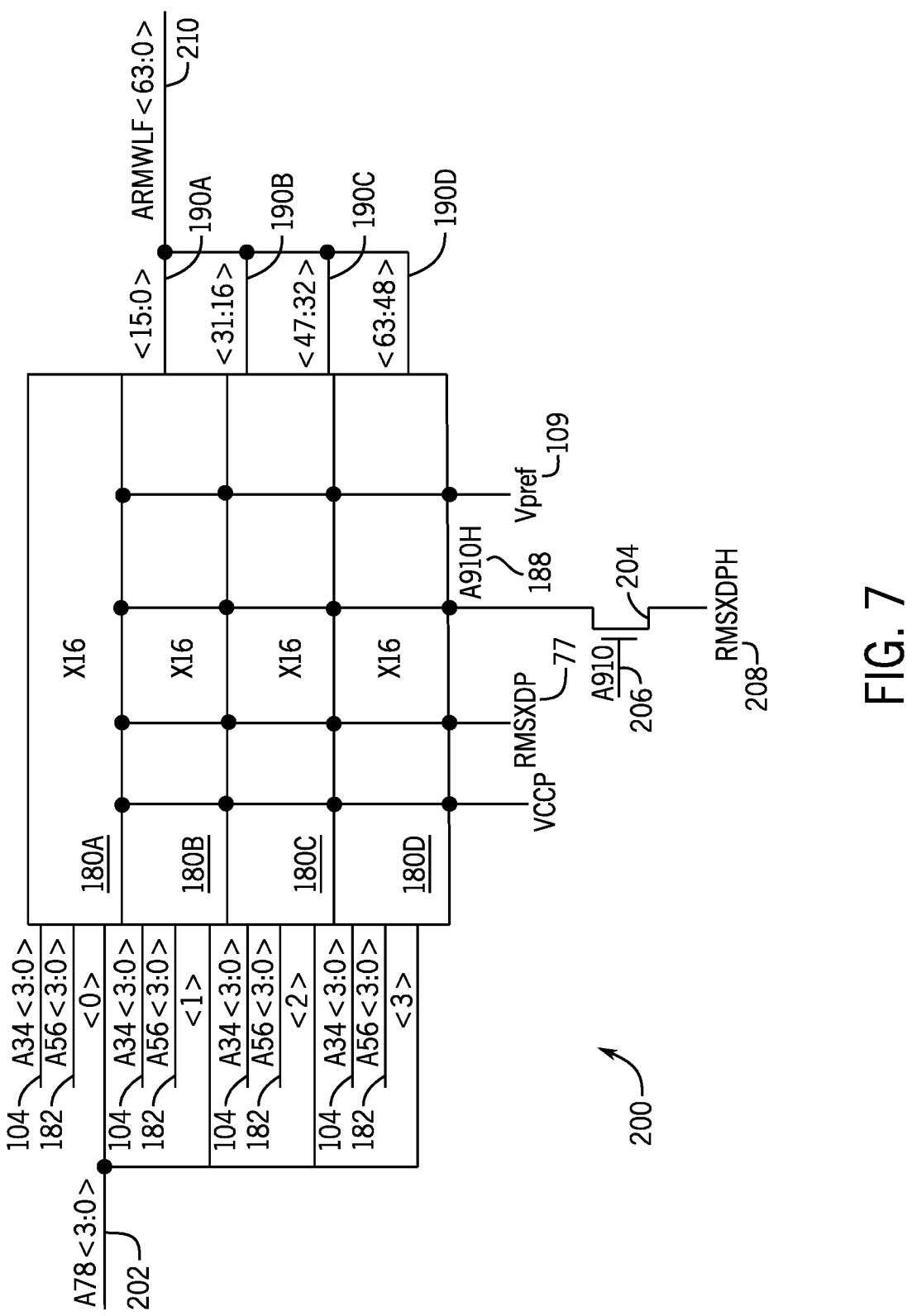
FIG. 7 is a circuit diagram of x64 decoding unit circuitry including four x16 decoding units of FIG. 6 to decode 64 bits for wordline usage, according to an embodiment of the present disclosure.

FIG. 7 is a diagram of an x64 main wordline decoder circuitry 200 that includes four x16 main wordline decoder circuitries 180 (individually referred to as 180A, 180B, 180C, and 180D). Each of the x16 main wordline decoder circuitries 180 receives its respective addressing bit of the address bits A78<3:0> 202. Each of the x1 main wordline decoder circuitries 140 of each of the x4 main wordline decoder circuitries 160 receives its respective addressing bit of the address bits A34<3:0> 104, and each of the x4 main wordline decoder circuitries 160 of each of the x16 main wordline decoder circuitries 180 receives its respective addressing bit of the address bits A56<3:0> 182. Each of the x16 main wordline decoder circuitries 180 outputs 16 respective bits of the ARMWLF<63:0> signal 210 that has 64 bits. The 16 respective bits may correspond to bits <15:0>, <31:16>, <47:32>, and <63:15> as ARMWLF signals 190 (individually referred to as 190A, 190B, 190C, and 190D). As illustrated, each of the x16 main wordline decoder circuitries 180 is coupled to the A910H node 188 and the Vpref 109. Each x16 main wordline decoder circuitry 180 may also be coupled to the RMSXDP signal 77 if the deactivation circuit 150 is used in the respective x1 main wordline decoder circuitries 140 and/or the precharge circuitry 170 is used in the respective x4 main wordline decoder circuitries 160.

The x64 main wordline decoder circuitry 200 also includes an NMOS transistor 204 that is used to at least partially control coupling the A910H node 188 to the common return. The connection through the NMOS transistor 204 may be controlled using a corresponding address bit of A910 206 used to select a specific instance of the x64 main wordline decoder circuitry 200. The NMOS transistor 204 is coupled to an RMSXDPH node 208 that, like the CN node 145, the A78H node 168, and the A910H node 188, may be a connection for the x64 main wordline decoder circuitry 200 to the common return through additional decoding circuitry.

Figure 8:
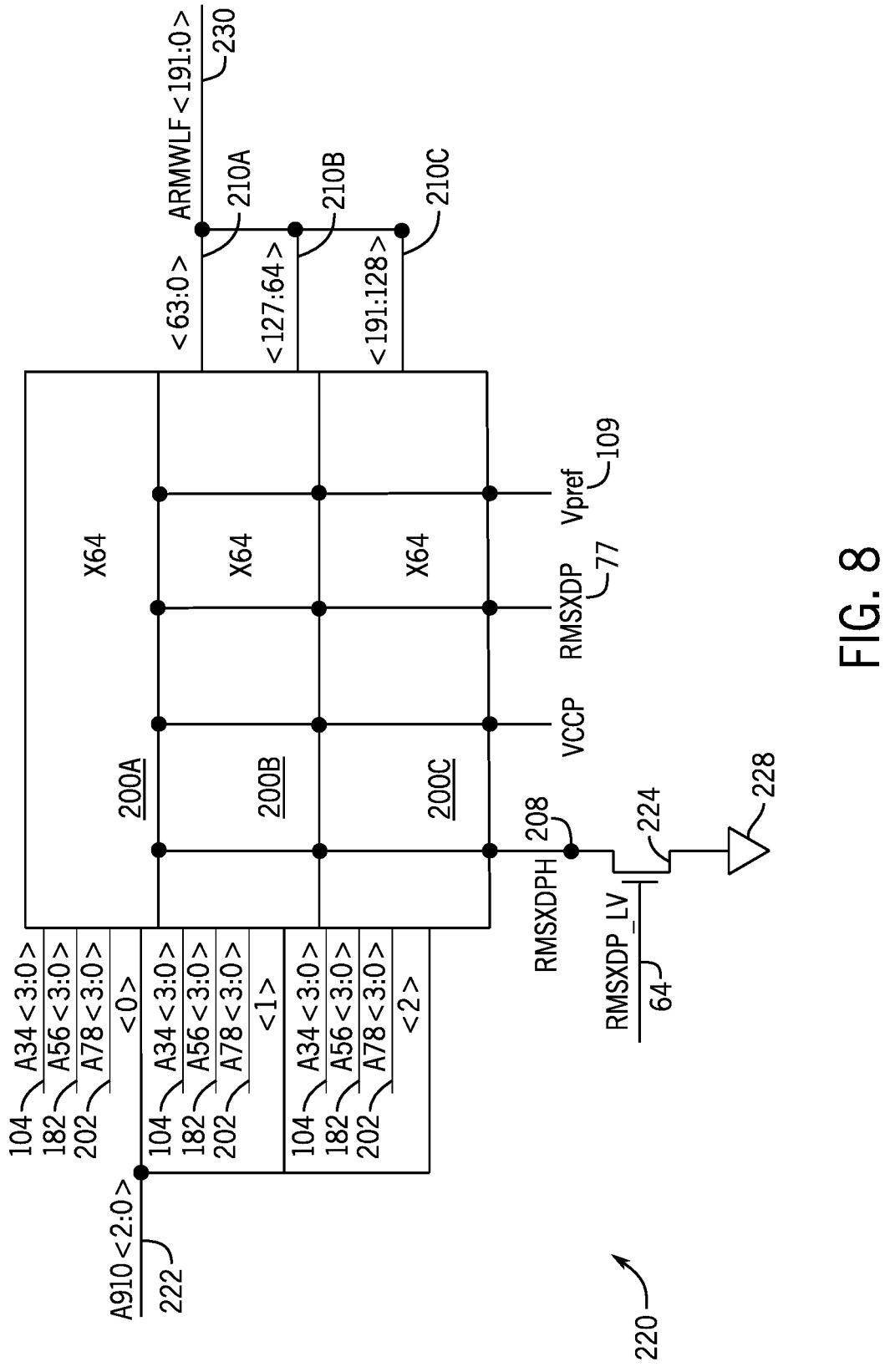
FIG. 8 is a circuit diagram of x192 decoding unit circuitry including three x64 decoding units of FIG. 7 to decode 192 bits for wordline usage, according to an embodiment of the present disclosure.

FIG. 8 is a diagram of a x192 main wordline decoder circuitry 220 that includes three x64 main wordline decoder circuitries 200 (individually referred to as 200A, 200B, and 200C). Each of the x64 main wordline decoder circuitries 200 receives its respective addressing bit of the address bits A910<2:0> 222. Each of the x1 main wordline decoder circuitries 140 of each of the x4 main wordline decoder circuitries 160 receives its respective addressing bit of the address bits A34<3:0> 104, each of the x4 main wordline decoder circuitries 160 of each of the x16 main wordline decoder circuitries 180 receives its respective addressing bit of the address bits A56<3:0> 182, and each of the x16 main wordline decoder circuitries of the x64 main wordline decoder circuitries 200 receives its respective addressing bit of the address bits A78<3:0> 202. Each of the x64 main wordline decoder circuitries 200 outputs 64 respective bits of the ARMWLF<191:0> signal 230 that has 192 bits. The 64 respective bits may correspond to bits <63:0>, <127:64>, and <191:128> as ARMWLF signals 210 (individually referred to as 210A, 210B, and 210C). As illustrated, each of the x64 main wordline decoder circuitries 200 is coupled to the RMSXDPH node 208 and the Vpref 109. Each x64 main wordline decoder circuitry 200 may also be coupled to the RMSXDP signal 77 if the deactivation circuit 150 is used in the respective x1 main wordline decoder circuitries 140 and/or the precharge circuitry 170 is used in the respective x4 main wordline decoder circuitries 160.

The x192 main wordline decoder circuitry 220 also includes an NMOS transistor 224 that is used to at least partially control coupling the RMSXDP node 208 to the common return. The connection through the NMOS transistor 224 may be controlled using a RMSXDP_LV signal used to select the section including the x192 main wordline decoder circuitry 220. The NMOS transistor 224 is coupled to the common return.

In summary, the addressing bits of A34 104 are used to specify x1 main wordline decoder circuitries 140 within x4 main wordline decoder circuitries 160. Similarly, the addressing bits of A56 182 are used to specify x4 main wordline decoder circuitries 160 within x16 main wordline decoder circuitries 180, and the addressing bits of A78 202 are used to specify x16 main wordline decoder circuitries 180 within x64 main wordline decoder circuitries 200. Likewise, the addressing bits of A910 206 are used to specify x64 main wordline decoder circuitries 200 within x192 main wordline decoder circuitries 220. Additionally, the RMSXDP_LV signal 64 is used to select section (e.g., a x192 main wordline decoder circuitry 220) of wordlines and driving circuitry. As indicated previously, each of these signals may be decoded using connections to gate terminals of respective transistors that control whether the common return is provided as a negative supply to a respective NMOS transistor 144 of the inverter 141 of FIG. 4. Furthermore, each of these addressing bits/section selection signal provides a connection through their respective transistors for this connection of the CN node 145 to the common return. As may be appreciated, each of these gating transistors may be sized according to the desired amount and/or speed of charge to be passed through the respective transistors.

Figure 9:
FIG. 9 is a layout diagram of the decoding unit circuitries of FIGS. 4-8, according to an embodiment of the present disclosure.

A layout may be used to accommodate the relatively large transistors (e.g., NMOS transistor 224). For instance, FIG. 9 is an embodiment of a layout 250 on the memory device 10. As illustrated, regions 252 and 254 may include the transistors used in implementing one instance of a x4 main wordline decoder circuitry 160. Specifically, the region 252 may include PMOS transistors 152 in column 256 (if deactivation circuit 150 is included), PMOS transistors 148 in a column 258, and PMOS transistors 142 in a column 260 all arranged horizontally along with a PMOS transistor 172 in a column 262 arranged vertically. The region 254 includes NMOS transistors 144 in a column 264 and NMOS transistors 162 in a column 266 all arranged horizontally along with an NMOS transistor 164 in a column 268 arranged vertically. The layout 250 also shows relatively large NMOS transistors 186, 204, and 224 arranged vertically with each being larger than the previous size. Using the shown arrangement, the circuitry of the main wordline decoder may be packed relatively tight while providing a relatively fast speed due to availability of relatively large NMOS transistors 164 (in column 268), 186, 204, and 224. Indeed, this size may be made even smaller (e.g., thinner) if the deactivation circuit 150 is omitted.

As may be appreciated, at least some edge/size limitations may change which decoder units that may be included. For instance, if 192×1 main wordline decoder circuitries 140 do not fit within a specified area, different distributions of the decoder units may be deployed where only a portion of a x1, ×4, ×16, ×64, or x192 may be deployed in a specific embodiment. To accommodate these differences at the edges, some columns (e.g., column 256) may include other transistors (e.g., PMOS transistor 270) to accommodate those differences. Furthermore, although the foregoing discusses groupings of specific numbers (e.g., 3 or 4) sub-units in each decoding unit (e.g., x1 main wordline decoder circuitry 140), other numbers for grouping may be used in some embodiments.

Figure 10:
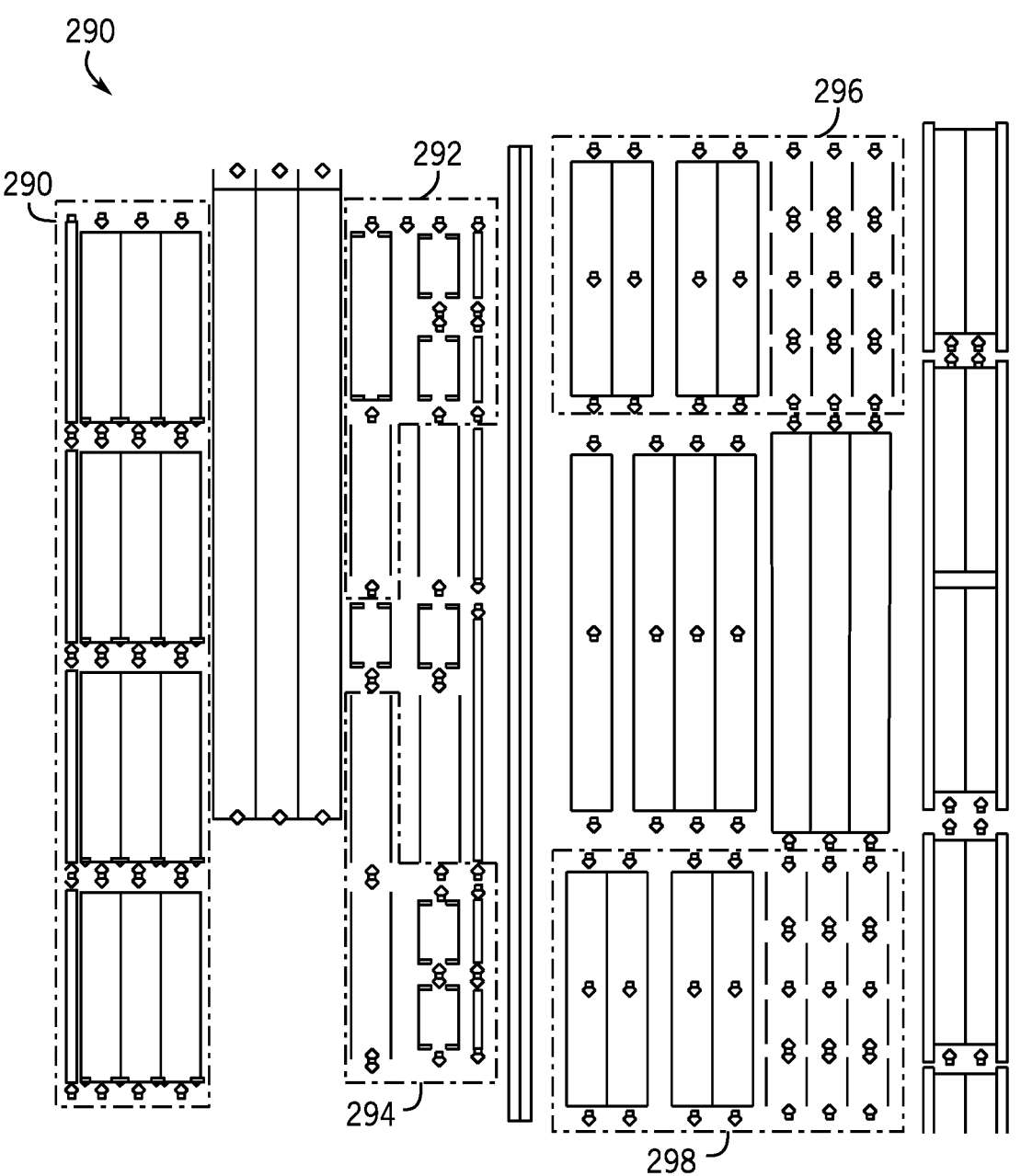
FIG. 10 is a layout diagram of the level shifting circuitries of FIGS. 2 and 3, according to an embodiment of the present disclosure.

FIG. 10 is a layout diagram of the level-shifting circuitry 50. As illustrated, the transistors of the addressing bit level shifters 78 may be arranged in regions 290, 292, 294, 296, and 298 to promote symmetry of deployment while the remaining portions of the layout may include the transistors of the remaining portions of the level-shifting circuitry 50 (e.g., the section select level shifter 66).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:
plurality of memory cells configured to store data;
a plurality of sense amplifiers configured to sense the data stored in the plurality of memory cells;
a plurality of wordlines configured to enable usage of the plurality of sense amplifiers; and
wordline decoding circuitry configured to decode which wordlines of the plurality of wordlines are to be used for a particular operation, wherein the wordline decoding circuitry comprises:
a plurality of wordline decoder sub-units used to decode a respective addressing bit of a plurality of addressing bits for a single wordline of the plurality of wordlines, wherein each of the wordline decoder sub-units comprises:
a first transistor;
a second transistor, wherein the first transistor and the second transistor are coupled together to implement an inverter that is configured to invert the respective addressing bit and to output a wordline arming signal configured to arm a corresponding wordline of the plurality of wordlines; and
a third transistor configured to bleed a charge on the wordline arming signal.

2. The memory device of claim 1, wherein the second transistor is coupled to a common node that is configured to be coupled to and decoupled from a common return by one or more transistors of the wordline decoding circuitry.

3. The memory device of claim 2, wherein bleeding the charge onto the wordline arming signal is configured to mitigate potential misfires in the memory device due to the common node floating to a value other than the common return.

4. The memory device of claim 2, wherein the common return comprises a ground connection.

5. The memory device of claim 2, wherein the first transistor comprises:
a gate terminal coupled to the respective addressing bit; and
a source terminal coupled to a supply voltage.

6. The memory device of claim 5, wherein the second transistor comprises:
a second gate terminal coupled to the respective addressing bit; and
a first terminal couple to a drain terminal of the first transistor; and
a second terminal coupled to the common return.

7. The memory device of claim 6, wherein the wordline arming signal is output from the inverter between the drain terminal of the first transistor and the first terminal of the second transistor.

8. The memory device of claim 7, wherein the third transistor comprises:
a third source terminal coupled to the supply voltage;
a third drain terminal coupled to the wordline arming signal; and
a third gate terminal coupled to a bleed voltage configured to cause the third transistor to bleed a charge from the supply voltage onto the wordline arming signal.

9. The memory device of claim 8, comprising a bleed voltage generation circuit comprising a fourth transistor comprising:
a fourth source terminal coupled to the supply voltage;
a fourth drain terminal; and
a fourth gate terminal coupled to the fourth drain terminal and configured to output the bleed voltage, wherein the bleed voltage is a threshold voltage less than the supply voltage.

10. The memory device of claim 9, wherein the wordline arming signal is configured to be asserted when it is logic low so that the bled charge causes the wordline arming signal to shift toward deassertion.

11. The memory device of claim 7, wherein the each of the wordline decoder sub-units comprises a deactivation circuit that is configured to pull the wordline arming signal to deassertion based on a deactivation of a section select signal configured to select a section of the wordline decoding circuitry that includes the plurality of wordline decoder sub-units.

12. The memory device of claim 11, wherein the deactivation circuit comprises a fourth transistor comprising:
a third source terminal coupled to the supply voltage;
a fourth third terminal coupled to the wordline arming signal; and
a third gate terminal coupled to the section select signal.

13. Wordline decoding circuitry, comprising:

a selection transistor configured to select a section of wordlines using a section select signal;

a plurality of decoding unit circuitries configured to decode a first set of addressing bits to a plurality of wordline arming bits each configured to arm a corresponding wordline, wherein each decoding unit circuitry comprises:

a plurality of sub-units each configured to decode a second set of addressing bits to a respective subset of the plurality of wordline arming bits, wherein each of the plurality of sub-units comprises:

an inverter configured to invert the second set of addressing bits and to output a wordline arming signal, wherein the inverter is coupled between a supply voltage and a common node that that is configured to be coupled to and decoupled from a common return by one or more transistors of the wordline decoding circuitry; and a bleed transistor that is configured bleed charge onto the wordline arming signal to mitigate for a potential floating condition of the common node.

14. The wordline decoding circuitry of claim 13, wherein each of the plurality of decoding unit circuitries comprises precharge circuitry configured to precharge the common node to the supply voltage when the plurality of decoding unit circuitries is disabled.

15. The wordline decoding circuitry of claim 14, wherein the precharge circuitry comprises a precharge transistor that comprises a gate terminal coupled to section select signal that causes the common node to be charged to the supply voltage when the section select signal is deasserted.

16. The wordline decoding circuitry of claim 15, wherein the precharge transistor comprises:

a source terminal coupled to the supply voltage; and a drain terminal coupled to the common node.

17. A memory device comprising:

a plurality of wordlines configured to enable usage of a plurality of sense amplifiers; and wordline decoding circuitry configured to decode which wordlines of the plurality of wordlines are to be used for a particular operation based on addressing bits and a section select signal, wherein the wordline decoding circuitry comprises:

level-shifting circuitry configured to shift the section select signal from a first voltage level to a second voltage level and to shift the addressing bits from a third voltage level to a fourth voltage level; and wordline decoding unit circuitry that comprises:

an inverter configured to invert the level-shifted addressing bits and to output a wordline arming signal, wherein the inverter is coupled between the second voltage level and a common node that is configured to be coupled to and decoupled from a common return by one or more transistors of the wordline decoding circuitry; and a bleed transistor that is configured bleed charge onto the wordline arming signal to mitigate for a potential floating condition of the common node.

18. The memory device of claim 17, wherein the first voltage level is the same as the third voltage level, and the second voltage level is the same as the fourth voltage level.

19. The memory device of claim 17, wherein the level-shifting circuitry comprises:

a first level shifter configured to shift the section select signal from the first voltage level to the second voltage level; and a plurality of second level shifters each configured to shift a respective addressing bit of the addressing bits from the third voltage level to the fourth voltage level.

20. The memory device of claim 19, wherein each of the plurality of second level shifters comprises:

a first inverter configured to invert and level shift the respective addressing bit; and a second inverter configured to buffer the inverted and level shifted respective bit.

* * * * *